United States Patent [19]

Okano et al.

[11] Patent Number: 4,682,268
[45] Date of Patent: Jul. 21, 1987

[54] MOUNTING STRUCTURE FOR ELECTRONIC CIRCUIT MODULES

[75] Inventors: Minoru Okano; Mitsuo Kohmoto, both of Tokyo, Japan

[73] Assignee: NEC Corporation, Tokyo, Japan

[21] Appl. No.: 825,453

[22] Filed: Feb. 3, 1986

[30] Foreign Application Priority Data

Feb. 7, 1985 [JP] Japan .................................. 60-20883
Feb. 7, 1985 [JP] Japan .................................. 60-20884
Feb. 19, 1985 [JP] Japan ............................ 60-21317[U]

[51] Int. Cl.$^4$ .............................................. H05K 7/20
[52] U.S. Cl. ...................................... 361/384; 361/413
[58] Field of Search .............. 361/383, 384, 386, 387, 361/388, 398, 412, 413; 165/80; 174/16 R; 62/414, 418; 339/112 R; 357/81, 82

[56] References Cited

U.S. PATENT DOCUMENTS

| 3,940,665 | 2/1976 | Seki ..................................... 361/383 |
| 4,158,875 | 6/1979 | Tajima et al. ........................ 361/384 |
| 4,403,271 | 9/1983 | Flanigan ............................. 361/383 |
| 4,519,013 | 5/1985 | Breeze ................................ 361/384 |

OTHER PUBLICATIONS

E. A. Wilson, "Accommodating LSI in a High Performance Computer", *Electronic Packaging and Production*, May 1982, pp. 142–152.

*Primary Examiner*—G. P. Tolin
*Attorney, Agent, or Firm*—Burns, Doane, Swecker & Mathis

[57] ABSTRACT

A mounting structure for electronic circuit modules includes electronic circuit modules each having a back panel, heat-generating electronic components each having a heat sink for heat radiation and mounted on one surface of the back panel, and first connectors mounted on the other surface of the back panel. A frame has first holes and a hollow inside structure for mounting the electronic circuit modules. Cable assemblies having second connectors at their ends pass through one of the first holes to connect with the first connectors within the frame. The electronic circuit modules are mounted onto the frame. The modules may be mounted onto the frame by second holes penetrating the back panel and guide pins formed on the frame in one-to-one correspondence with the second holes. A heat radiating structure may include openings opposed to the heat sinks in one-to-one correspondence, and fans for sucking air from the vicinity of the heat sinks into the inside of the heat radiating structure through the openings.

8 Claims, 9 Drawing Figures

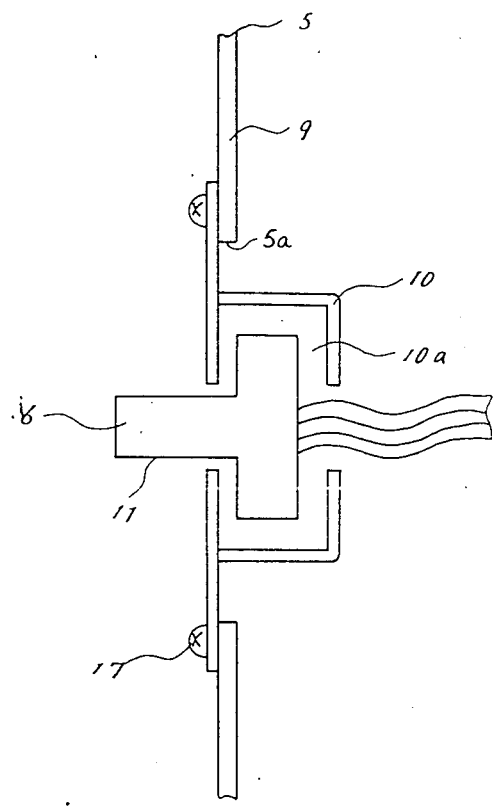

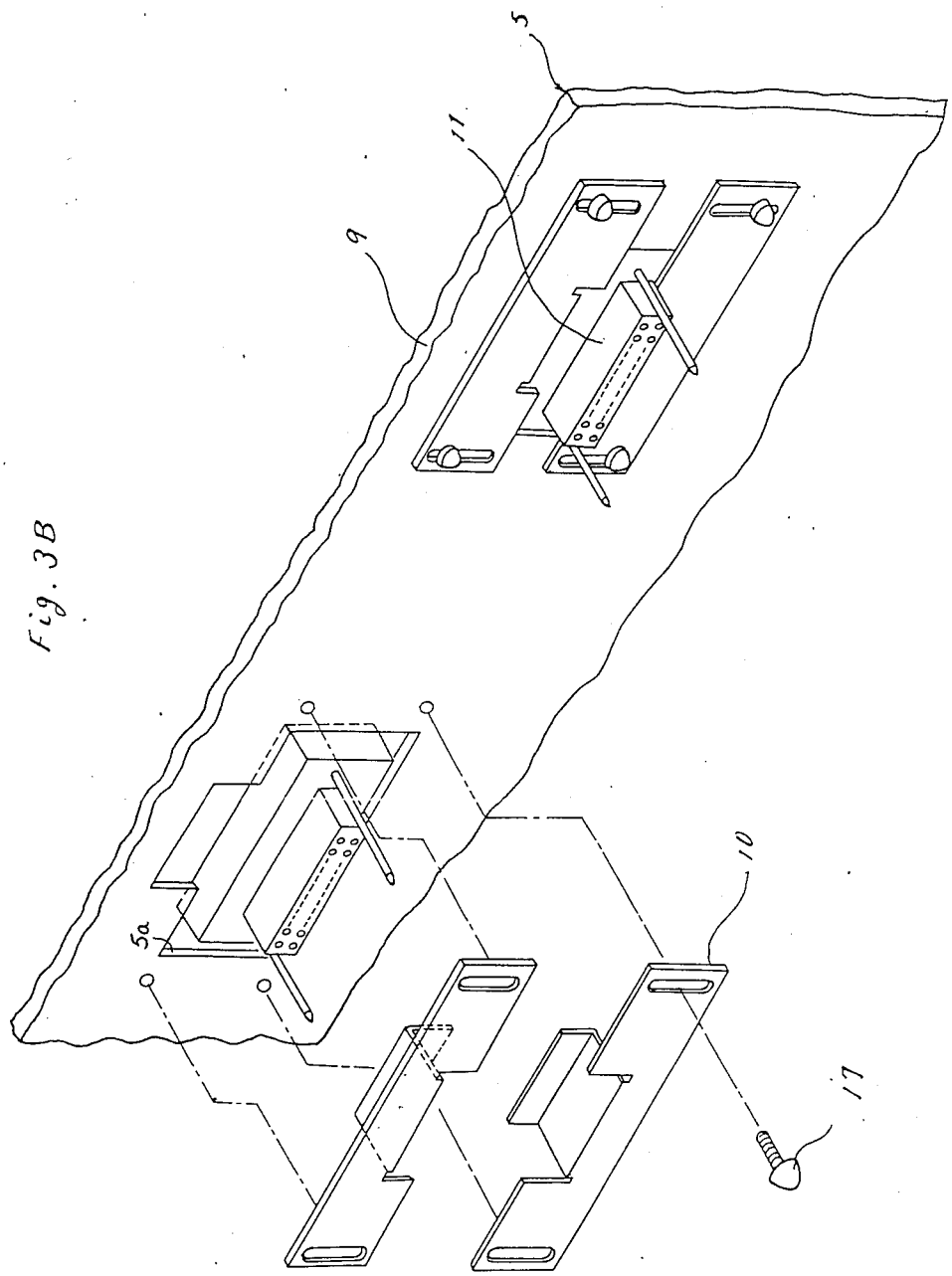

MOUNTING STRUCTURE FOR ELECTRONIC CIRCUIT MODULES

BACKGROUND OF THE INVENTION

The present invention relates to a mounting structure for electronic circuit modules having heat-generating electronic components such as large-scale integrated circuits (LSI's).

One example of such mounting structures, in the prior art, is disclosed in a paper entitled "Accommodating LSI in a high performance computer" by E. A. Wilson, published in ELECTRONIC PACKAGING and PRODUCTION, May 1982, pages 142 to 152. In this proposed structure, two boards, each of which mounts a plurality of micropackages, are arranged opposite to each other, and the electrical connections between the boards are achieved by connecting the edges of the respective boards with cables. Because of this connection structure, the distances required for the electrical connections between the micropackages mounted near the center on one board and the packages mounted on the other board tend to be long, resulting in increased signal propagation delays between the packages.

Another example of the prior art mounting structures is disclosed in U.S. Pat. No. 4,158,875. Though this structure has an advantage that air used as a coolant uniformly flows to each of printed circuit wiring boards 2, downstream heat-generating electronic components 1 cannot be cooled fully, because coolant air is warmed by the heat from upstream heat-generating electronic components 1.

An object of the present invention is, therefore, to provide a mounting structure for electronic circuit modules free from the above-mentioned disadvantages.

SUMMARY OF THE INVENTION

According to an aspect of the invention, there is provided a mounting structure for electronic circuit modules which includes: a plurality of electronic circuit modules each having a back panel, a plurality of heat-generating electronic components each having a heat sink for heat radiation and mounted on one surface of said back panel, and a plurality of first connectors mounted on the other surface of said back panel;

a frame having a plurality of first holes and a hollow inside structure for mounting said plurality of electronic circuit modules;

a plurality of cable assemblies, each of which has at its both ends second connectors engaged with one of said first connectors through one of said plurality of first holes, for connecting said first connectors within said frame; and means for mounting said plurality of electronic circuit modules onto said frame.

BRIEF DESCRIPTION OF THE DRAWINGS

The features and advantages of the present invention will become apparent from the following description when taken in conjunction with the accompanying drawings in which:

FIGS. 3A and 3B show a cross-sectional view and a perspective view for illustrating the relationship among covers 10, connectors 11 and a base frame 9;

In the drawings, the same reference numerals represent the same structural elements.

DETAILED DESCRIPTION OF THE PREFERRED EMBODIMENTS

Now the present invention will be described in detail with reference to the accompanying drawings.

Figure 1:
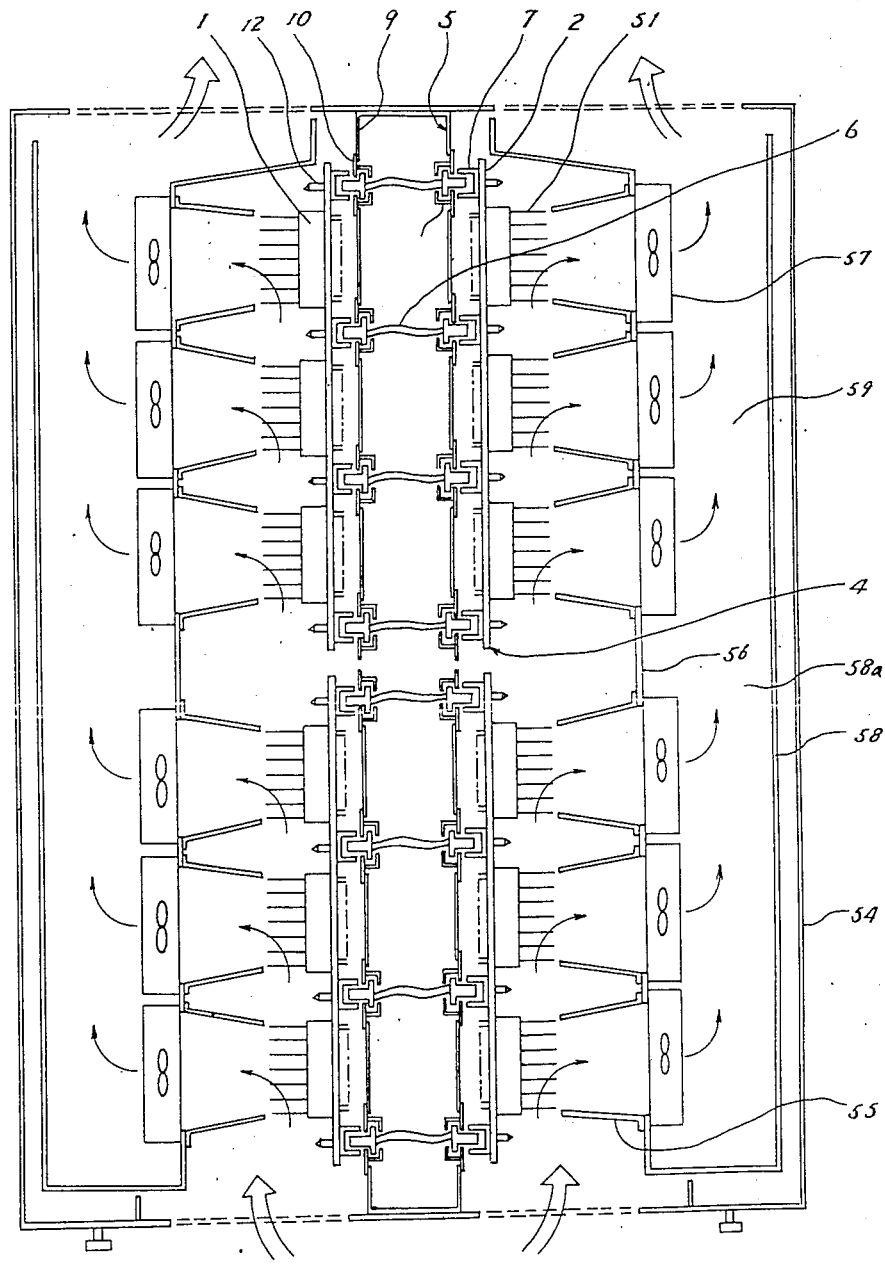
FIG. 1 shows a cross-sectional view of a first embodiment of the invention.

Referring to FIG. 1 a first embodiment of the invention includes a cabinet 54, a frame 5 fixed to the cabinet 54, four electronic circuit modules 4, a plurality of fan boxes 55, a plurality of fans 57, two exhaust duct members 58, and a plurality of cable assemblies 6.

Figure 2:
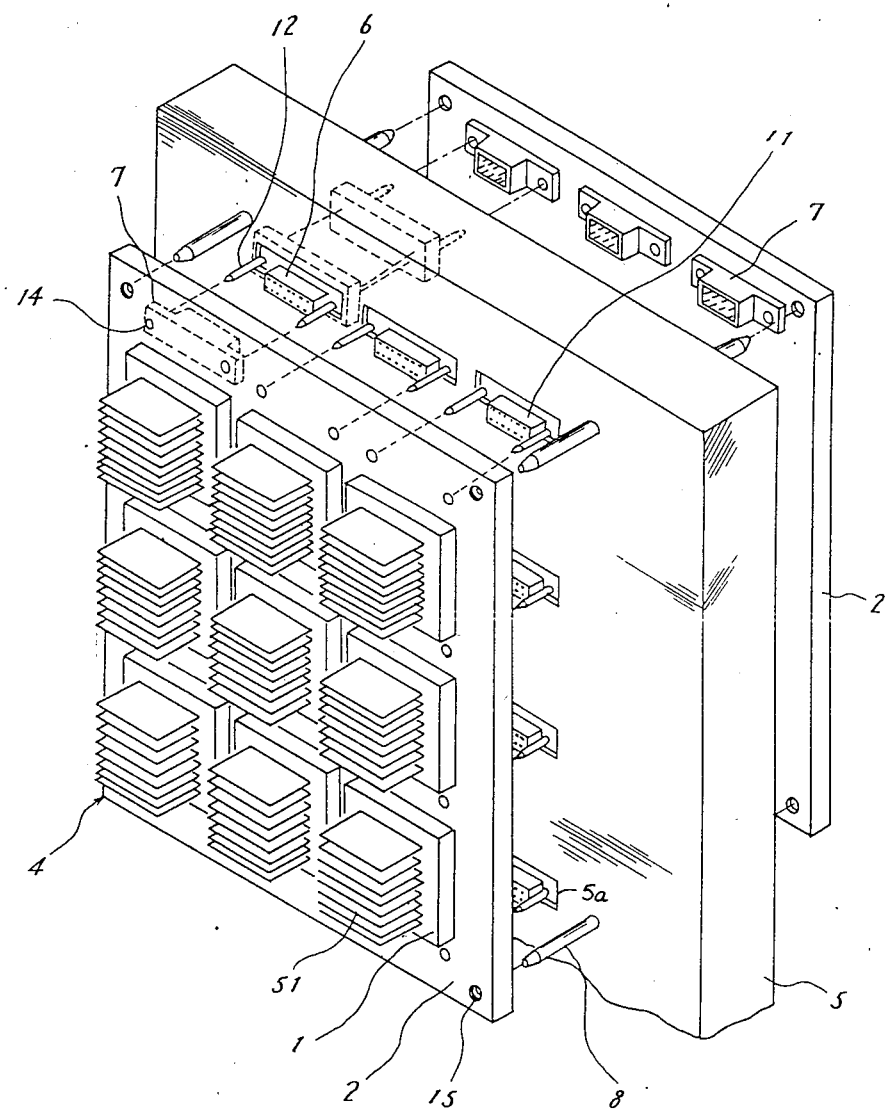
FIG. 2 shows a perspective view of electronic circuit modules 4 and a frame 5.

Referring now to FIG. 2, each of the modules 4 includes a back panel 2, a plurality of LSI packages 1 mounted on the upper surface of the panel 2 and each having a heat sink 51, and a plurality of male connectors 7 attached onto the lower surface of the panel 2 opposite to the upper surface thereof. To the right and left of each male connector 7 are provided cable guide holes 14 penetrating the panel 2. Four board guide holes 15 are formed in four corners of the panel 2, respectively. Corresponding to the board guide holes 15 of the panel 2, board guide pins 8 are formed on the frame 5.

Figure 4:
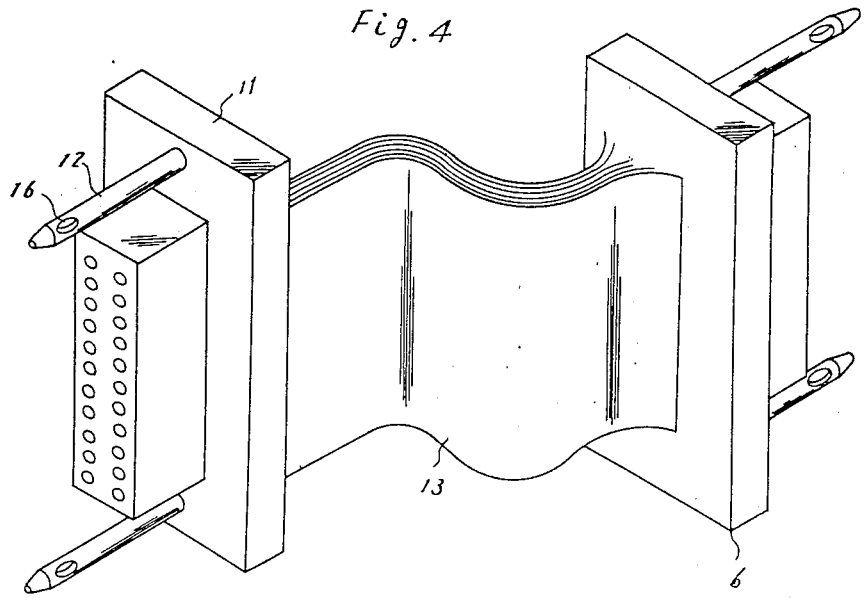
FIG. 4 shows a perspective view of a cable assembly 6.

Referring to FIG. 4, each of the cable assemblies 6 has female connectors 11 at both ends thereof, which are connected through a wire part 13.

Referring to FIGS. 3A and 3B, the frame 5 is composed of a base frame 9 and covers 10 fixed with screws 17. The inside of the frame 5 is formed to have a hollow structure. Each of the connectors 11 is so held within a housing part 10a defined by a pair of covers 10 as to be able to move slightly. As shown in FIG. 1, the cable assemblies 6 are housed within the frame 5. Each of the connectors 11 is engaged with a predetermined one of the connectors 7 provided on the panels 2 to achieve appropriate connection between the LSI packages.

Referring to FIG. 2, panels 2 are fitted to the frame 5 in the following manner. The panels 2 are arranged on opposite sides of the frame 5 so that the frame 5 faces the lower surfaces of the panels 2. Each of the board guide pins 8 on the frame 5 and the corresponding one of the board guide holes 15 of one of the panels 2 are aligned and then engaged with each other. At this time, each of cable guide pins 12 of the cable assemblies 6 penetrates the corresponding one of the cable guide holes 14 of the panels 2, each of the male connectors 7 and the corresponding one of the female connectors 11 are aligned with each other, and the pins 12 are projected from the upper surfaces of the panels 2. Since the connectors 11 of the assemblies 6 are slightly movable to be fitted to the frame 5, each of the male connectors 7 and the corresponding one of the female connectors 11 can be readily engaged with or disengaged from each other by pulling or pushing the connectors 11 with a specific tool through catching holes 16 shown in FIG. 4 of the pins 12 of the connectors 11.

Figure 6:
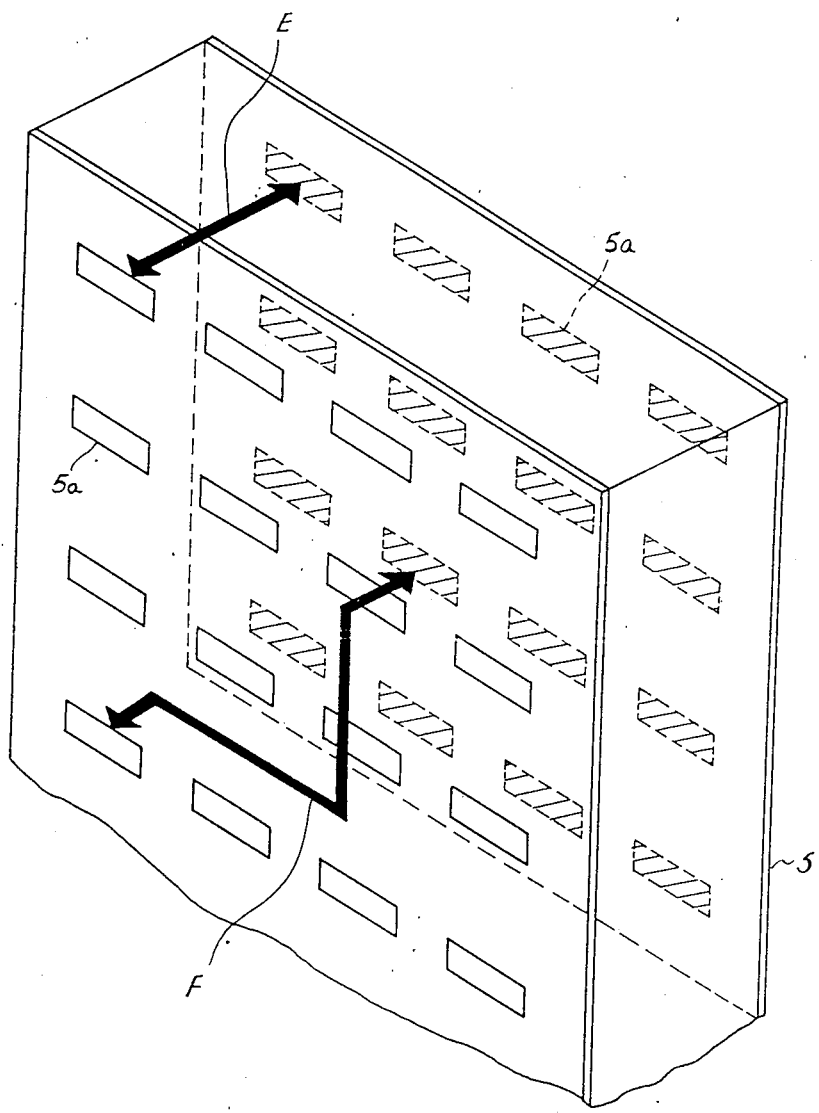
FIG. 6 shows a perspective view for illustrating the method of connection by the cable assembly 6.

The electrical connections using the cable assemblies 6 via holes 5a formed within the frame 5 can be attained through arbitrary routes as, for instance, indicated by arrows "E" and "F" shown in FIG. 6.

Figure 5:
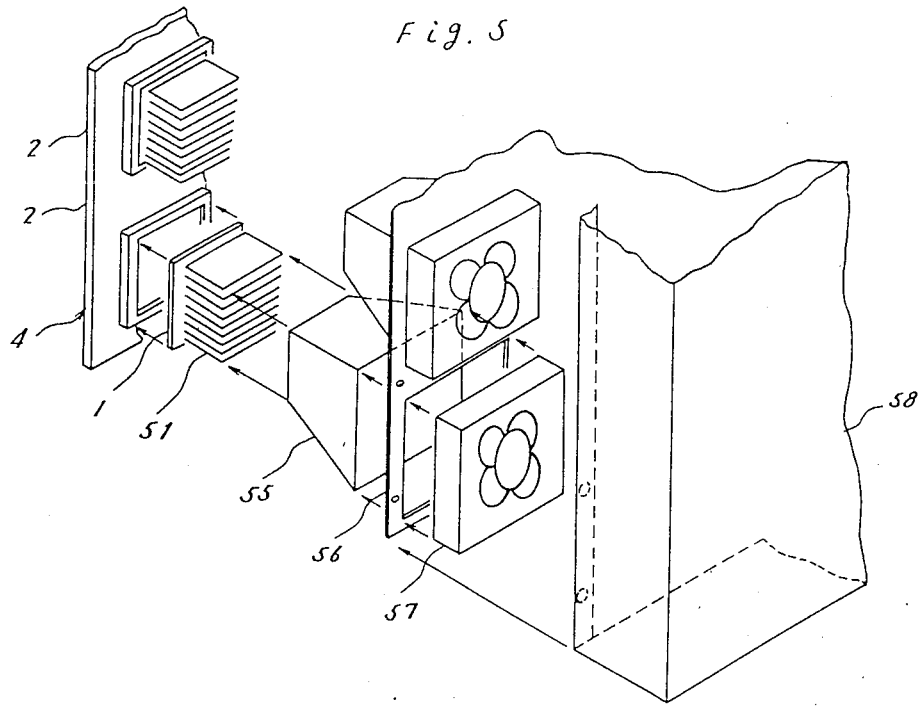
FIG. 5 is a perspective view of the vicinity of a fan box 55.

Referring now to FIG. 5, each of the fan boxes 55 is formed in the shape of a truncated pyramid. One end of each of the boxes 55 has a first rectangular opening matching the shape of each of the heat sinks 51 of the packages 1, while the other end has a second rectangular opening matching the shape of each of the fans 57. The fan boxes 55 are provided in one-to-one correspondence with the packages 1. Each of board-shaped fan-supporting frames 56 is arranged with a predetermined interval from the upper surfaces of the corresponding two of the plates 2. Each of the fan boxes 55 is so fitted to the frames 56 that the first opening of the fan box faces the corresponding one of the heat sinks 51. Each of the frames 56 has openings, each of which matches the shape of the second opening of each of the fan boxes 55. The fans 57 are so fitted as to cover the openings of the frames 56, respectively. Thus each of the fans 57 is provided at one end of the corresponding one of the fan boxes 55 via the frames 56. In other words, each of the fan boxes 55 forms an air passage through which coolant air flows from the surface of the corresponding heat sink to the corresponding fan.

The duct members 58 are so fitted to the frames 56 as to wholly cover the back side of each of the fans 57, respectively. Each of the duct members 58 and the corresponding one of the frames 56 constitute an exhaust duct 59 shown in FIG. 1, whose top is open.

Each of the heat sinks 51 is so formed in a plate shape as to have a predetermined surface area and to reduce the air flow pressure. The fans 57 suck air lying in the vicinity of the heat sinks 51 into the exhaust ducts 59 via the fan boxes 55. When one of the fans 57 is driven, the pressure within the corresponding one of the fan boxes 55 is reduced. As a result, coolant air introduced from the bottom of the cabinet 54 shown in FIG. 1 is sucked through the vicinity of the heat sinks 51 into the fan boxes 55 and, after its pressure is increased by the fans 57, is discharged out of the cabinet 54 through the upper openings of the exhaust ducts 59.

Here, since the volume of the space around each of the heat sinks 51 is relatively large and the pressure loss between the bottom opening of the cabinet 54 and each heat sink is sufficiently low, the temperatures of the air supplied to the heat sinks 51 can be substantially equalized to each other by appropriately selecting the length of each of the fan boxes 55, so that the cooling conditions of all the LSI packages 1 can be substantially uniformalized. Thus, unlike in the prior art, the coolant air supplied to a heat sink is not heated by other heat sinks. In other words, the heat sinks 51 can be effectively cooled with low-temperature air.

As a result, where the air flow rate is equal to that in the prior art, an adequate cooling effect can be achieved even if the calorific values of the packages 1 increase. On the other hand, where the calorific values of the packages 1 are equal to that in the prior art, the air flow rate can be reduced, so that less noisy, smaller fans can be used.

Since the fans 57 for cooling the packages 1 are arranged facing the packages 1, the electronic circuit modules 4 can be mounted close to each other on the same plane, with the result that the distances of the electrical connections between the packages 1 of the different modules 4 can be reduced. Further, since the electrical connections between the packages 1 of the opposite modules 4 are achieved within the frame 5 by the cable assemblies 6, the distances of the electrical connections can be selected to be the shortest, respectively. For these reasons, the signal propagation delays between the packages 1 can be remarkably decreased in the embodiment.

Further, since the packages 1 and the fans 57 are provided in one-to-one correspondence with each other, each of the packages and fans can be attached or detached independent of the others, so that the packages 1 and the fans 57 can be more readily maintained and, if necessary, changed.

Although in the above embodiment each one of the fans 57 is mounted on one of the fan supporting frames 56 at one end of the fan boxes 55, the present invention is not limited to this arrangement of the fans 57. For instance, the fan and the fan box may be integrated to be located on the side of the exhaust duct 59.

Figure 7:
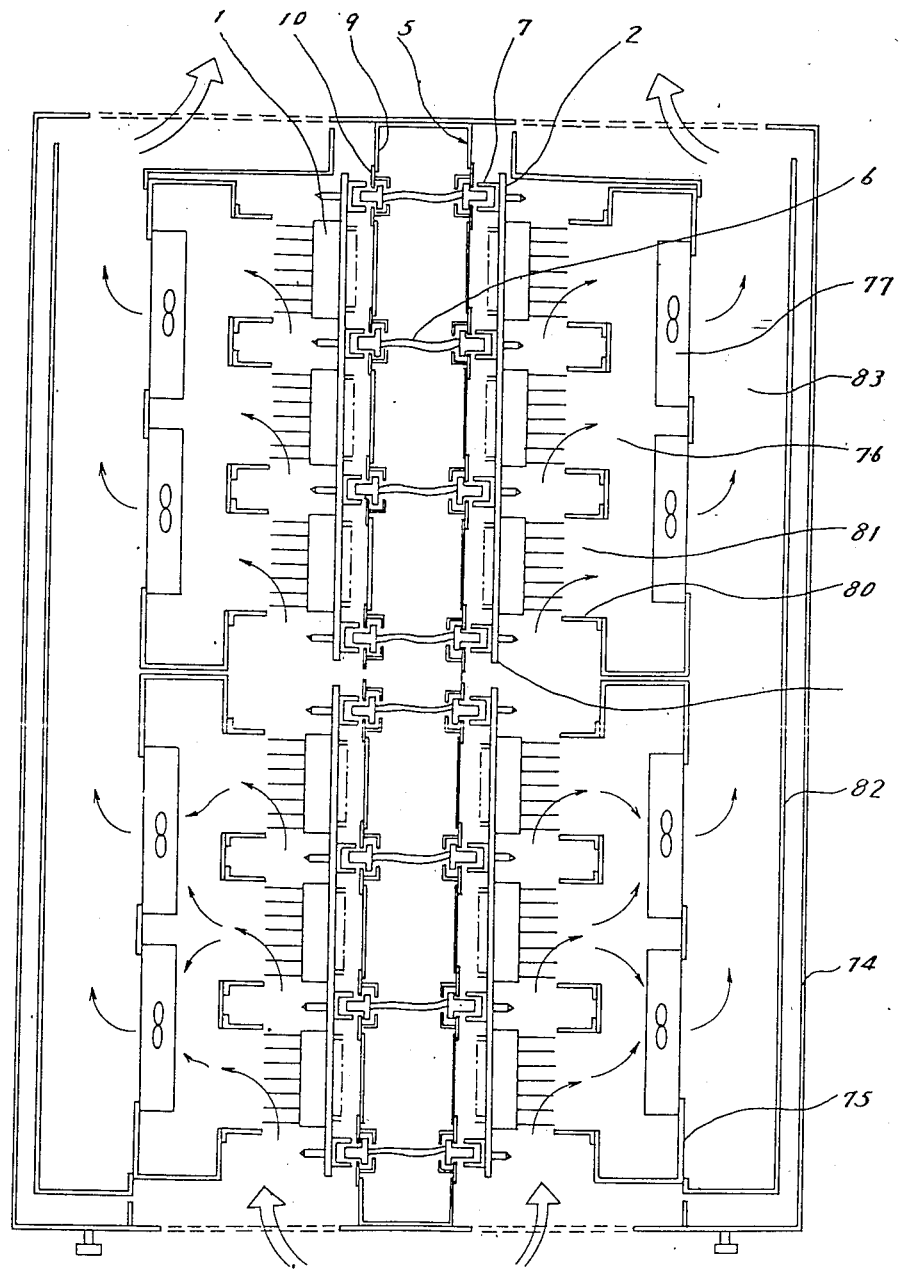
FIG. 7 shows a cross-sectional view of a second embodiment of the invention.
Figure 8:
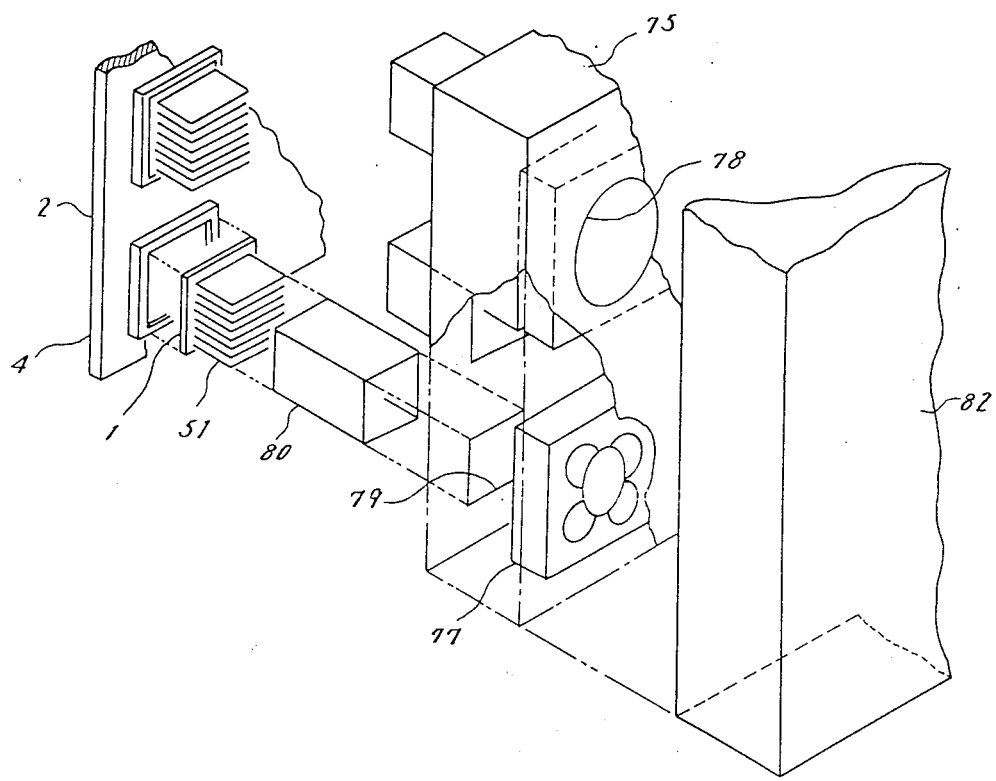
FIG. 8 is a perspective view of the vicinity of a fan box 75.

Next will be described a second preferred embodiment of the invention with reference to FIGS. 7 and 8.

In this embodiment, fan boxes are shaped differently from those in the above-mentioned first embodiment. A plurality of fan boxes 75 are provided at predetermined intervals from the upper surfaces of the plates 2, respectively. These fan boxes 75 are formed in a box shape. Each of the boxes 75 forms an air chamber 76 with a plurality of fans 77. On the rear surface of each fan box 75 are bored circular openings 78, and on its front surface are bored rectangular openings 79 which are opposed to the heat sinks 51 of the LSI packages 1, respectively.

Duct members 80 are connected to the openings 79 of the fan boxes 75, respectively. One end of each duct member 80 is open toward the heat sink 51 of the corresponding package 1 to constitute an air passage 81 through which coolant air flows from the heat sink 51 to the inside of the fan box 75. Exhaust duct members 82 wholly cover the rear surfaces of the fan boxes 75, and form exhaust ducts 83 through which th air flows from the inside of the fan boxes 75 to the outside of a cabinet 74 via their openings 78, respectively.

In the embodiment thus structured, the pressures in the air chambers 76 are reduced when the fans 77 are driven, so that the coolant air introduced from the bottom openings of the cabinet 74 into the cabinet 74 is sucked from the vicinity of the heat sinks 51 into the air chambers 76 through the ducts 81 and, after its pressure is increased by the fans 77, is discharged out of the cabinet 74 through the upper openings of the exhaust ducts 83.

Since, in this embodiment, the fans 77 are installed within the fan boxes 75, the noise outside of the cabinet 74 can be kept low by suppressing the noise of the fans 77 with the fan boxes 75.

Because this embodiment has a plurality of fans 77 in each of the fan boxes 75, if the capacity and the number of the fans 77 are so selected as to give a more than sufficient overall flow rate, even in case of a malfunction of any one of them the corresponding electronic circuit module 4 could still continue sufficiently to be cooled.

While this invention has been described in conjunction with the preferred embodiments thereof, it will now readily be possible for those skilled in the art to put this invention into practice in various other manners.

What is claimed:

1. A mounting structure with electronic circuit modules comprising:

a plurality of said electronic circuit modules each having a back panel, a plurality of heat-generating electronic components each having a heat sink for heat radiation and mounted on one surface of each of said back panels, and a plurality of first connectors mounted on the other surface of each of said back panels;

a frame having a plurality of first holes and defining a hollow inside structure for mounting said plurality of electronic circuit modules;

a plurality of cable assemblies, each of which has at its both ends second connectors engaged with one of said first connectors through one of said plurality of first holes, and connecting said first connectors within said frame; and means mounting said plurality of electronic circuit modules onto said frame.

2. A mounting structure with electronic circuit modules as claimed in claim 1, wherein said mounting means is composed of a plurality of second holes penetrating each of said back panels and a plurality of guide pins formed on said frame in one-to-one correspondence with said plurality of second holes, said guide pins located in said second holes.

3. A mounting structure with electronic circuit modules as claimed in claim 1, wherein said frame is mounted within a cabinet.

4. A mounting structure with electronic circuit modules as claimed in claim 3, further comprising: heat radiating means which includes openings formed in the structure opposite to the heat sinks in one-to-one correspondence; and fans mounted in the structure for sucking air lying in the vicinity of said heat sinks into the inside of the heat radiating means through said openings.

5. A mounting structure with electronic circuit modules as claimed in claim 4, further comprising: exhaust means defined by the structure for guiding the air sucked by said heat radiating means out of said cabinet.

6. A mounting structure with electronic circuit modules as claimed in claim 3, further comprising: at least one fan box is arranged in the vicinity of said electronic circuit modules.

7. A mounting structure with electronic circuit modules as claimed in claim 6, wherein said fan box has at least one opening facing the corresponding electronic circuit module and at least one fan for sucking air.

8. A mounting structure with electronic circuit modules as claimed in claim 7, further comprising: exhaust means defined by the structure for guiding the air sucked into said fan box out of said cabinet.

* * * * *